United States Patent
Tsuchiyama

(10) Patent No.: US 7,119,430 B2
(45) Date of Patent: Oct. 10, 2006

(54) SPACER FOR MOUNTING A CHIP PACKAGE TO A SUBSTRATE

(75) Inventor: Yuji Tsuchiyama, Kumamoto (JP)

(73) Assignee: Hitachi, Ltd., Tokyo-to (JP)

( * ) Notice: Subject to any disclaimer, the term of this patent is extended or adjusted under 35 U.S.C. 154(b) by 396 days.

(21) Appl. No.: 10/237,083

(22) Filed: Sep. 9, 2002

(65) Prior Publication Data
US 2003/0056965 A1 Mar. 27, 2003

(30) Foreign Application Priority Data
Sep. 10, 2001 (JP) ............................... 2001-274153

(51) Int. Cl.
*H01L 23/48* (2006.01)
*H01R 9/00* (2006.01)
(52) U.S. Cl. ...................... 257/696; 257/730; 257/773; 361/772; 361/783; 361/810
(58) Field of Classification Search ................ 257/686, 257/690, 704, 723, 724, 731–733; 361/724, 361/728, 735, 736, 741, 752, 756, 758, 807
See application file for complete search history.

(56) References Cited
U.S. PATENT DOCUMENTS

| 5,045,921 A | * | 9/1991 | Lin et al. ...................... 257/680 |
| 5,051,870 A | * | 9/1991 | Companion ................... 361/773 |
| 5,561,323 A | * | 10/1996 | Andros et al. ............... 257/707 |
| 5,633,533 A | * | 5/1997 | Andros et al. ............... 257/707 |
| 5,898,575 A | * | 4/1999 | Hawthorne et al. .......... 361/809 |
| 5,917,703 A | * | 6/1999 | Murphy ....................... 361/704 |
| 6,535,393 B1 | * | 3/2003 | Akram et al. ................ 361/760 |

FOREIGN PATENT DOCUMENTS

JP  8-2430  1/1996

* cited by examiner

*Primary Examiner*—Alonzo Chambliss
(74) *Attorney, Agent, or Firm*—Foley & Lardner LLP

(57) ABSTRACT

In a drive circuit for an electric motor, there is provided a circuit board, at least one semiconductor device mounted to the circuit board and a spacer. The semiconductor device has a semiconductor chip, a chip package incorporating therein the semiconductor chip and comprising a mounting member for mounting on the circuit board, and terminals for connections of the semiconductor chip to the circuit board. The spacer is interposed between the circuit board and the mounting member of the chip package so as to provide a space between the circuit board and the chip package.

22 Claims, 8 Drawing Sheets

SPACER FOR MOUNTING A CHIP PACKAGE TO A SUBSTRATE

BACKGROUND OF THE INVENTION

The present invention relates to a drive circuit for an electric motor used to e.g. generate an assist torque for a power steering, which can avoid various problems (such as malfunction and breakage) caused by heat from a semiconductor chip or chips. The present invention also relates to a method for assembling such a drive circuit.

Japanese Laid-Open Patent Publication No. 8-2430 discloses a drive circuit for an electric motor in a power steering. In this type of drive circuit, a radiator is provided separately from a circuit board in order to radiate heat from semiconductor chips and prevent chip packages sealing therein the semiconductor chips from thermally expanding. This makes it possible to prevent other circuit components from being adversely affected by the thermal expansion of the chip packages. However, the drive circuit has to be assembled by attaching the chip packages to the radiator so that the chip packages and the radiator are brought into intimate contact with each other, and then, soldering terminals of the semiconductor chips to the circuit board. The process for assembling the drive circuit is so complicated that the manufacturing cost of the drive circuit is increased.

SUMMARY OF THE INVENTION

Another type of drive circuit is proposed, in which semiconductor chips are mounted on a circuit board without a radiator. In such a drive circuit, terminals of the semiconductor chips are soldered to the circuit board with a predetermined space provided between the circuit board and chip packages, thereby preventing other circuit components from being adversely affected even when the packages thermally expand due to heat from the semiconductor chips. However, it becomes necessary to perform the following additional assembling steps of interposing a jig between the circuit board and the packages before soldering the terminals to the circuit board and removing the jig after soldering. The process for assembling the drive circuit is thus complicated, and the manufacturing cost of the drive circuit is increased.

It is therefore an object of the present invention to provide a drive circuit for an electric motor, which can be assembled through a simple process for reduction in manufacturing cost while avoiding various problems caused by heat from a semiconductor chip or chips.

It is also an object of the present invention to provide a method for assembling such a drive circuit.

According to an aspect of the present invention, there is provided a drive circuit for an electric motor, comprising: a circuit board; at least one semiconductor device mounted to the circuit board, the semiconductor device comprising a semiconductor chip, a chip package incorporating therein the semiconductor chip and comprising a mounting member for mounting on the circuit board, and terminals for connections of the semiconductor chip to the circuit board; and a spacer interposed between the circuit board and the mounting member of the chip package so as to provide a space between the circuit board and the chip package.

According to another aspect of the present invention, there is provided a method for assembling a drive circuit for an electric motor, comprising: placing a spacer on a circuit board; providing at least one semiconductor device comprising a semiconductor chip, a chip package incorporating therein the semiconductor chip and comprising a mounting member for mounting on the circuit board, and terminals for connections of the semiconductor chip to the circuit board; fitting the mounting member of the chip package onto the spacer with a space provided between the circuit board and the chip package; and then soldering the terminals of the semiconductor device to the circuit board.

The other objects and features of the present invention will also become understood from the following description with reference to the accompanying drawings.

DESCRIPTION OF THE EMBODIMENT

Figure 1:
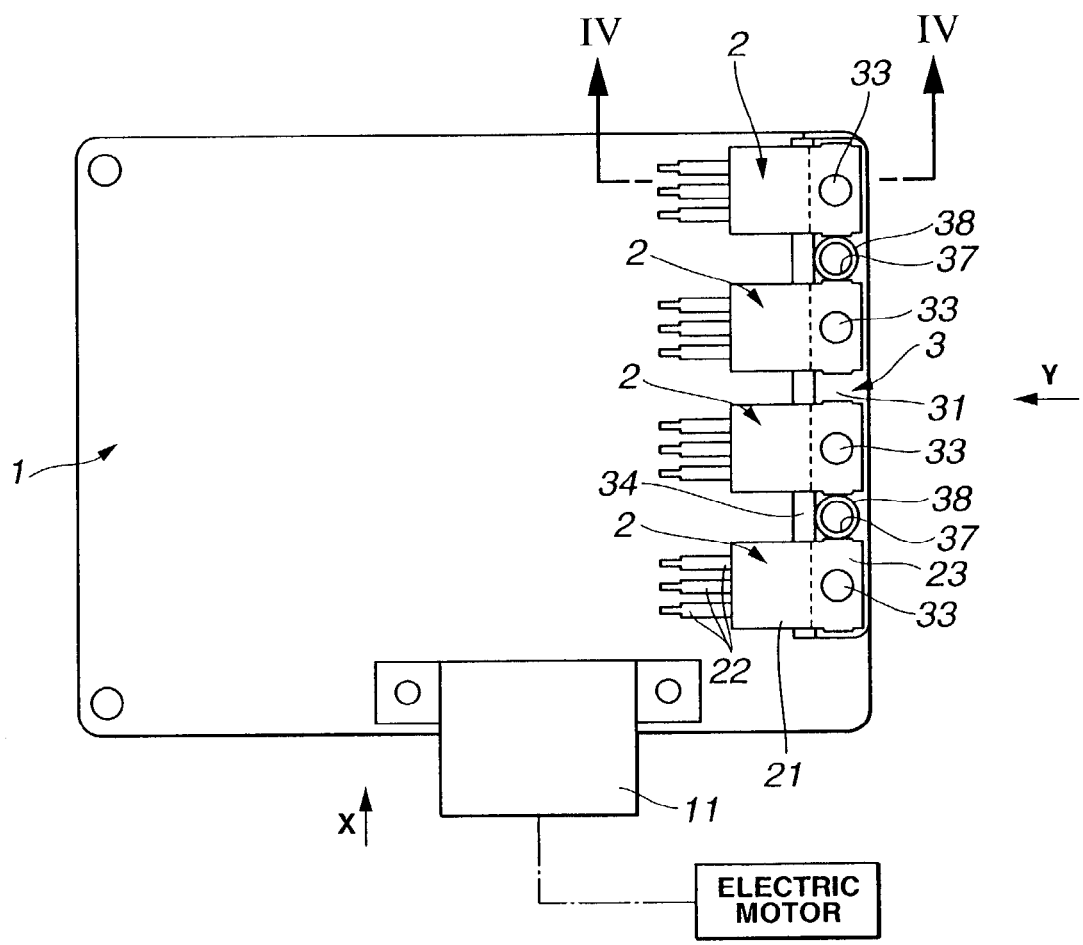
FIG. 1 is a plan view of a drive circuit for an electric motor according to an embodiment of the present invention.
Figure 2:
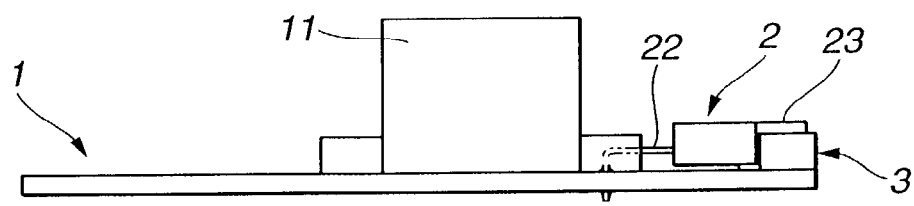
FIG. 2 is a side view of the drive circuit, when viewed in the direction of an arrow X of FIG. 1.
Figure 3:
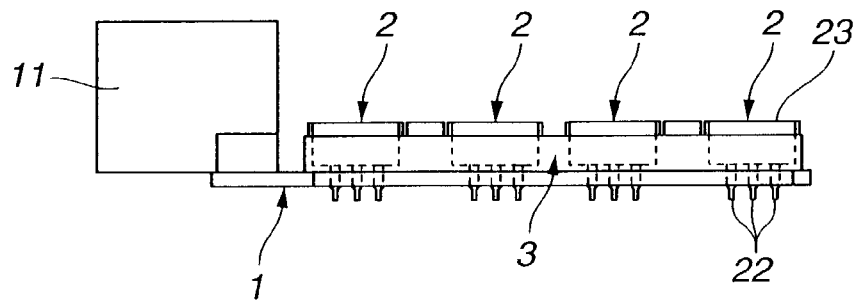
FIG. 3 is a side view of the drive circuit, when viewed in the direction of an arrow Y of FIG. 1.
Figure 4A:
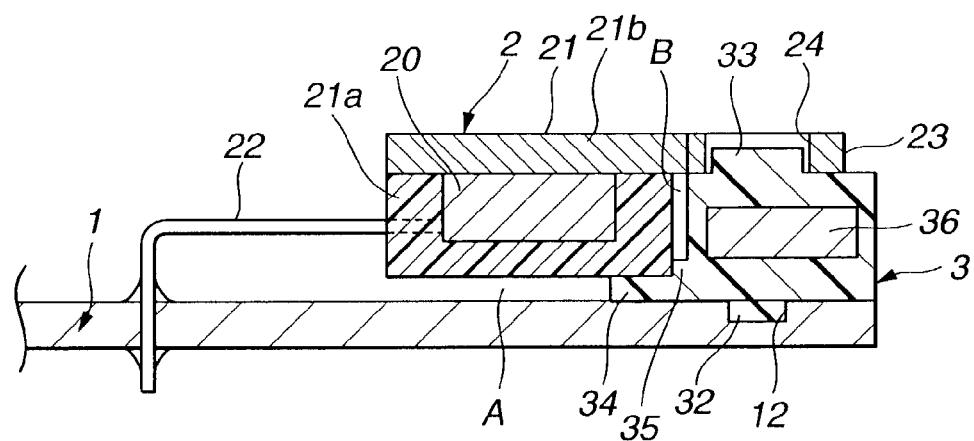
FIG. 4A is a sectional view of the drive circuit, when taken along a line IV—IV of FIG. 1.
Figure 4B:
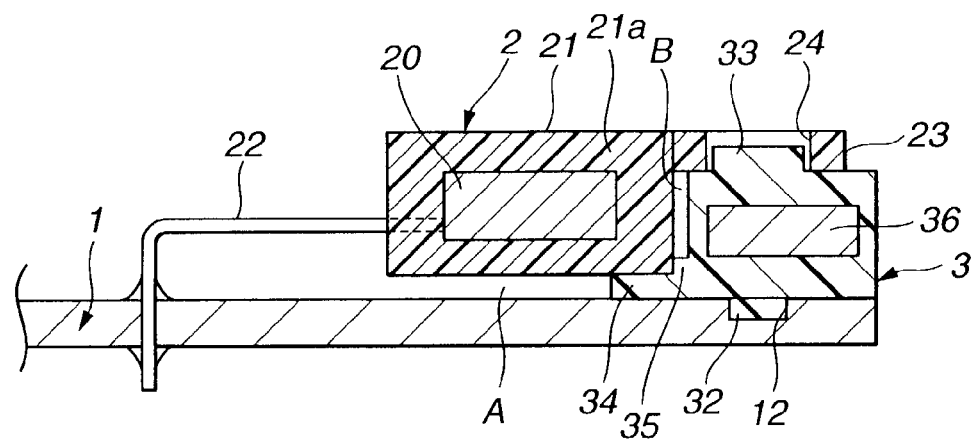
FIG. 4B is a sectional view of a modification of the drive circuit.
Figure 5:
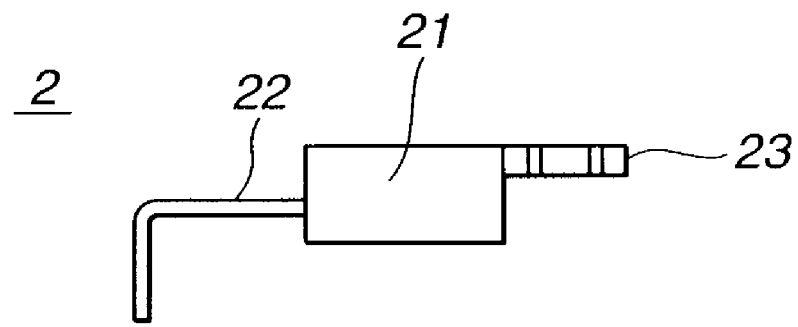
FIG. 5 is a side view of a semiconductor device of the drive circuit according to the embodiment of the present invention.
Figure 6:
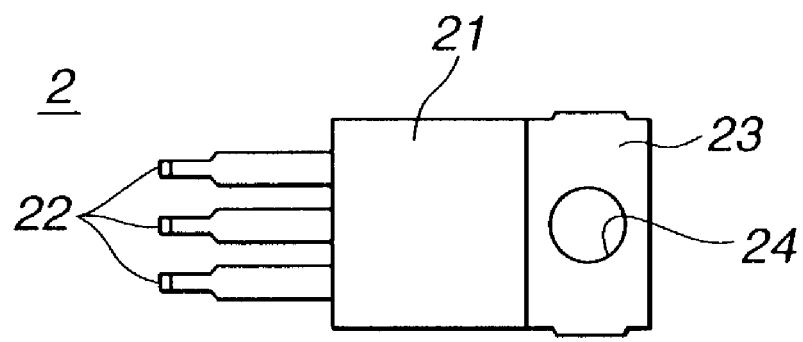
FIG. 6 is a plan view of the semiconductor device.
Figure 7:
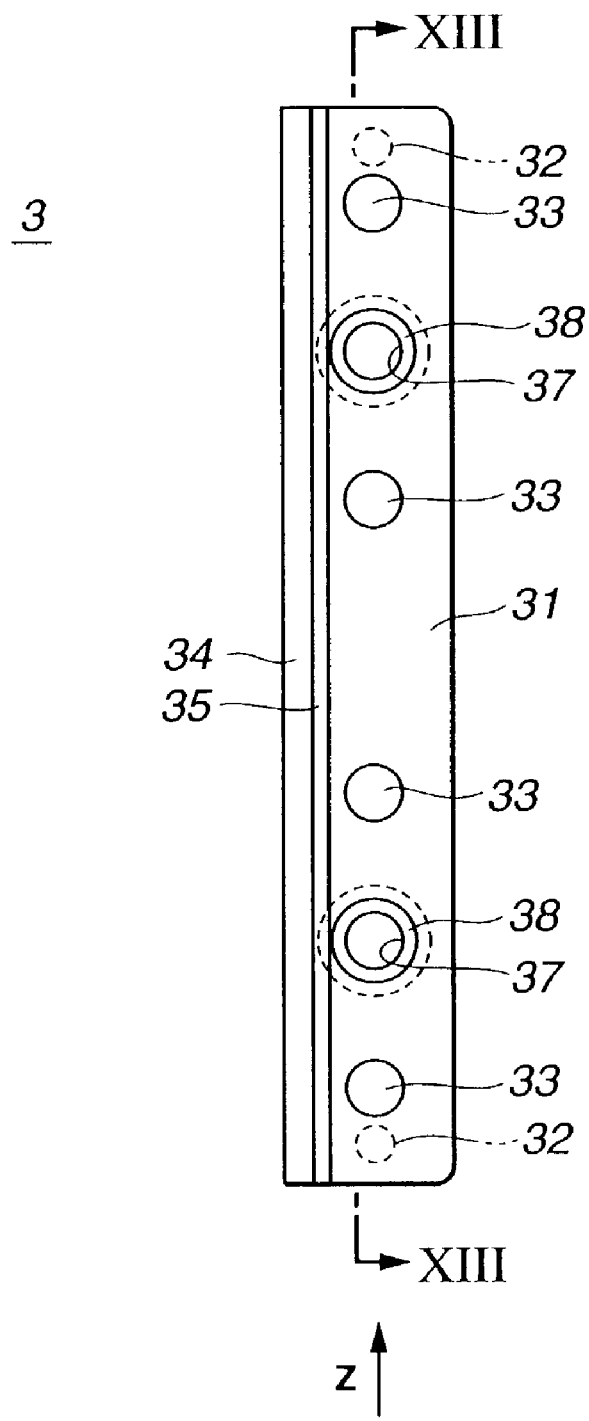
FIG. 7 is a plan view of a spacer of the drive circuit according to the embodiment of the present invention.
Figure 8:
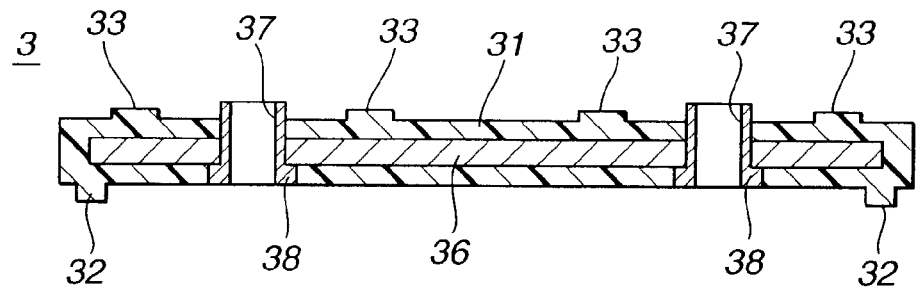
FIG. 8 is a sectional view of the spacer, when taken along a line VIII—VIII of FIG. 7.
Figure 9:
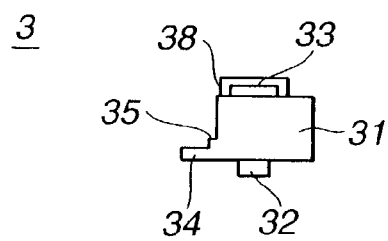
FIG. 9 is a side view of the spacer, when viewed in the direction of an arrow Z of FIG. 7.
Figure 10:
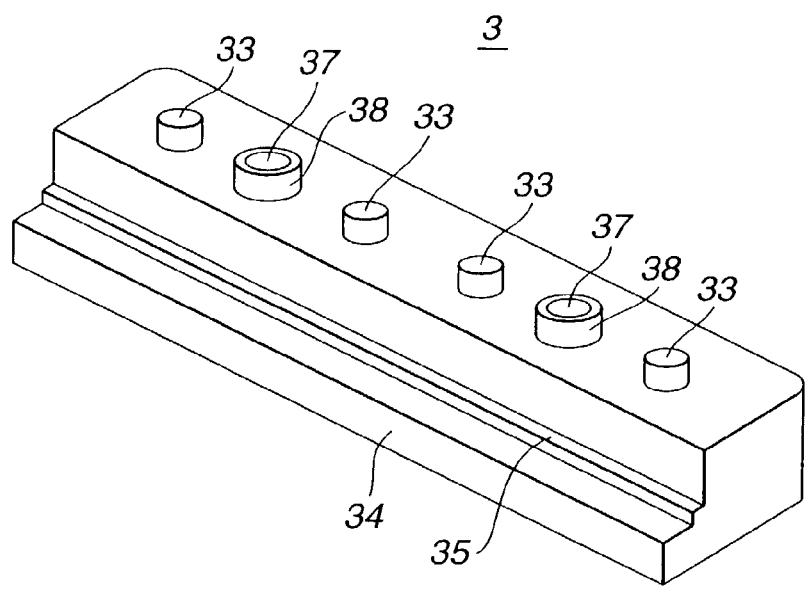
FIG. 10 is a perspective view of the spacer.

Hereinafter, the present invention will be described in more detail with reference to the drawings. The following embodiment refers to a drive circuit for an electric motor in a power steering, although the present invention can be embodied as a drive circuit for an electric motor used in any apparatus.

Referring to FIGS. 1 to 10, a drive circuit for an electric motor according to one embodiment of the present invention has circuit board 1, at least one semiconductor device 2 and spacer 3. In the present embodiment, four semiconductor devices 2 are mounted to circuit board 1 so that the drive circuit is formed into a bridge circuit.

Circuit board 1 is a printed circuit board, and connector 11 is provided to circuit board 1 for connection to the electric motor and to a power supply circuit (not shown).

Semiconductor devices 2 are mounted to circuit board 1 to drive the electric motor in a forward or backward direction by the control of current flowing through the electric motor, thereby generating an assist torque for a power steering. Each of semiconductor devices 2 includes semiconductor chip 20, chip package 21 incorporating therein semiconductor chip 20 and terminals 22 for connections of semiconductor chip 20 to circuit board 1. Chip package 21 includes resinous component 21a with or without metal component 21b, so as to seal semiconductor chip 20 in chip package 21 by resin mold. Further, mounting member 23 with positioning hole 24 is integrally formed on chip package 21 for mounting semiconductor device 2 to circuit board 1. Terminals 22 are protruded from chip package 21 in one direction, while mounting member 23 is protruded in a direction opposite to the protruding direction of terminals 22 along one surface (i.e. an upper side in FIG. 4A) of chip package 21 so that mounting member 23 functions as a cooling fin.

In order for semiconductor devices 2 to be mounted to circuit board 1 with space A provided between circuit board 1 and chip packages 21, spacer 3 is interposed between circuit board 1 and mounting members 23 of chip packages 21. This makes it possible to avoid other circuit components from being adversely affected even when chip packages 21 thermally expand due to heat from semiconductor chips 20.

Spacer 3 is integrally molded of synthetic resin, including spacer body 31, positioning protrusions 32 and 33, supporting protrusion 34 and step 35.

Spacer body 31 is formed into a rectangle having such a thickness as to provide space A between circuit board 1 and chip packages 21 in a state where mounting members 23 of chip packages 21 are fitted onto spacer body 31 and terminals 22 are soldered to circuit board 1.

Positioning protrusions 32 are formed on both ends of spacer body 31 so as to be engaged in positioning holes 12 of circuit board 1 for proper positioning of spacer 3 to circuit board 1. Further, four positioning protrusions 33 are formed on spacer body 31 at predetermined intervals so as to be engaged in positioning holes 24 of mounting members 23 for proper positioning of semiconductor devices 2 to spacer 3. This makes it possible to avoid misalignments among circuit board 1, semiconductor devices 2 and spacer 3.

Herein, an inner diameter of positioning hole 24 is made larger than a diameter of positioning protrusion 33 so that positioning protrusion 33 has loose fit in positioning hole 24 to make play for a movement of semiconductor device 2 in a radial direction of positioning hole 24 relative to spacer 3. In such a structure, the thermal expansion of chip packages 21 can be cancelled out by the play between positioning hole 24 and positioning protrusion 33 so as to protect terminals 22 from stress.

Supporting protrusion 34 is formed so as to project from spacer body 31 and become interposed between circuit board 1 and chip packages 21. In the unlikely event that mounting member 23 of chip packages 21 become broken, supporting protrusion 34 serves as a support for chip packages 21 in order to maintain space A.

Step 35 is formed at the corner of spacer body 31 and supporting protrusion 34 and brought in contact with chip package 21 so as to provide space B between chip packages 21 and spacer body 31 for efficient heat radiation.

Metallic reinforcing plate 36 is longitudinally provided through spacer body 31, and two cylindrical sleeves 38 with threaded mounting holes 37 are provided vertically through spacer body 31 and reinforcing plate 36 at positions between two adjacent positioning protrusions 33 such that threaded mounting holes 37 correspond in position to mounting holes 13 (shown in FIG. 12) of circuit board 1.

Figure 11:
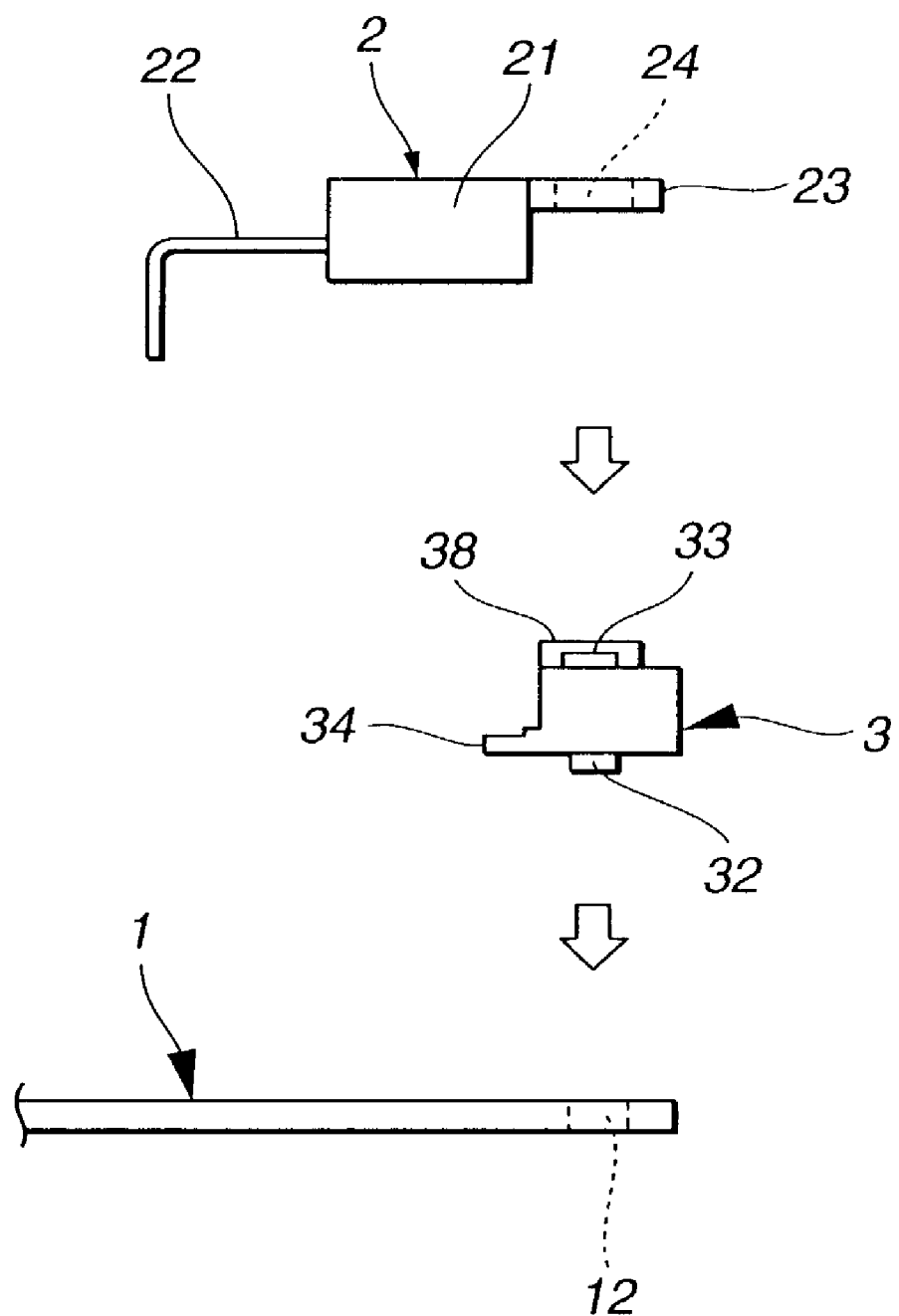
FIG. 11 is an exploded view showing how to mount the semiconductor device on the circuit board according to the embodiment of the present invention.

As shown in FIG. 11, circuit board 1, semiconductor devices 2 and spacer 3 are assembled in the following steps.

Firstly, spacer 3 is attached to circuit board 1 and properly held in position relative to circuit board 1 by engagement of positioning holes 12 and positioning protrusions 32.

Then, each semiconductor device 2 is placed by fitting mounting member 23 of chip package 21 onto spacer body 31 of spacer 3 and inserting terminals 22 into respective through holes (not shown) of circuit board 1. Semiconductor device 2 is properly held in position relative to circuit board 1 and spacer 3 by engagement of positioning hole 24 and positioning protrusion 33. In this state, chip package 21 is supported on supporting protrusion 34 of spacer 3 while being brought into contact with step 35.

Finally, terminals 22 are soldered to circuit board 1 while holding mounting members 23 to spacer body 31. With spacer 3 interposed between circuit board 1 and chip packages 21, it is possible to solder terminals 22 to circuit board with great facility while supporting semiconductor devices 2 stably with terminals 22 and mounting members 23 of chip packages 21 and thereby possible to reduce the manufacturing cost of the drive circuit through such simplification of circuit assembling process.

Figure 12:
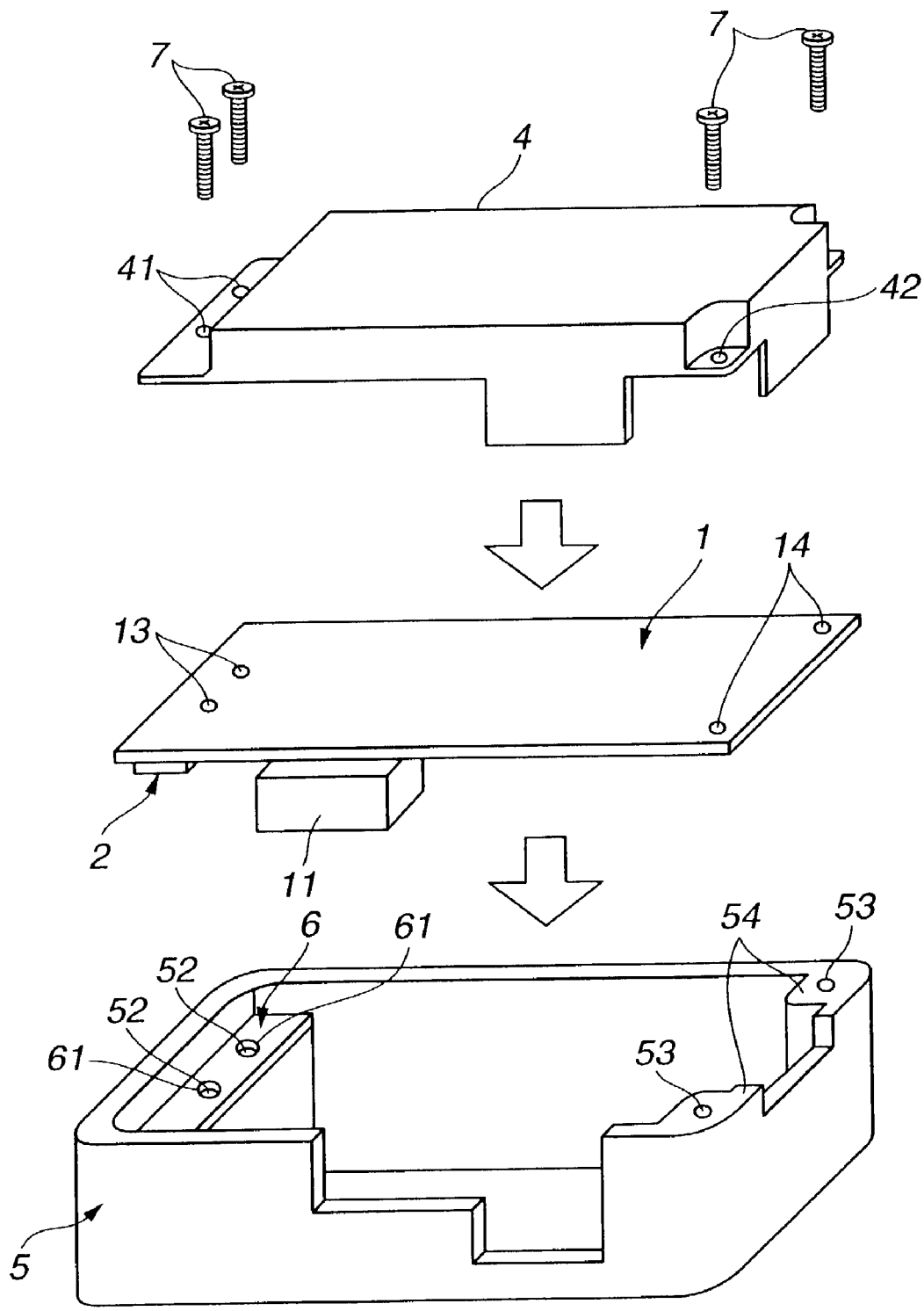
FIG. 12 is an exploded view showing how to install the assembly of the circuit board, the semiconductor devices and the spacer in a casing according to the embodiment of the present invention.
Figure 13:
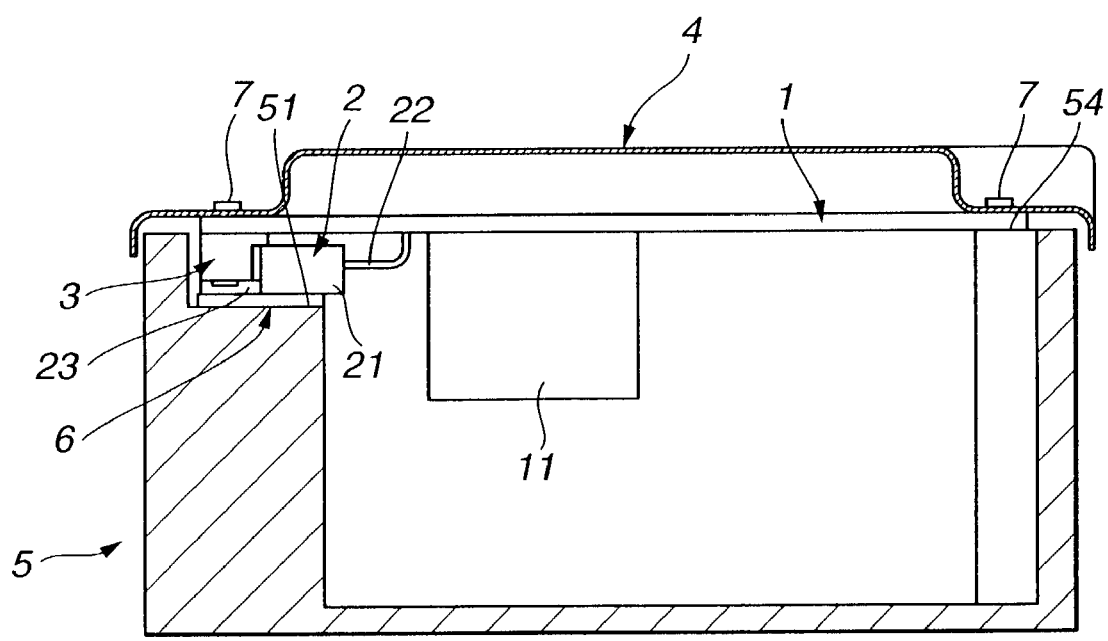
FIG. 13 is a sectional view of the drive circuit in a state where the assembly of the circuit board, the semiconductor devices and the spacer is being installed in the casing.

The assembly of circuit board 1, semiconductor devices 2 and spacer 3 is installed in lid 4 and case 5, as shown in FIGS. 12 and 13.

Case 5 is generally formed into a box with an opening, and has mounting step 51 along one inner wall of case 5 for supporting thereon semiconductor devices 2 via insulative cooling sheet 6 and mounting portions 54 at both corners on the opposite inner wall of case 5 for supporting the corners of circuit board 1 formed with mounting holes 14. Threaded mounting holes 52 and insertion holes 61 are formed in mounting step 51 and insulative cooling sheet 6, respectively, so as to correspond in position to mounting holes 13 of circuit board 1. Further, threaded mounting holes 53 are formed in mounting portions 54 so as to correspond in position to mounting holes 14 of circuit board 1.

Lid 4 is adapted to be put over case 5 to cover the assembly of circuit board 1, electric devices 2 and spacer 3. Insertion holes 41 and 42 are formed in lid 4 so as to correspond in position to mounting holes 13 and 14, respectively.

The assembly of circuit board 1, semiconductor devices 2 and spacer 3 is put in case 5 such that chip packages 21 with mounting members 23 are supported on mounting step 51 via insulative cooling sheet 6 while the corners of circuit board 1 formed with the mounting holes 14 are placed on the mounting portions 54, and then, covered with lid 4. In this state, mounting holes 13, insertion holes 41, insertion holes 61 and mounting holes 52 are held in alignment, and mounting holes 14, insertion holes 42 and mounting holes 53 are held in alignment.

Then, the assembly of circuit board 1, semiconductor devices 2 and spacer 3 and lid 4 are jointly fastened to case 5 using screws 7 through insertion holes 41 and 42, mounting holes 13 and 14, insertion holes 61 and mounting holes 52 and 53. By sharing screws 7 to fix the assembly of circuit board 1, semiconductor devices 2 and spacer 3 and lid 4, it becomes possible to reduce the number of parts and the number of assembling steps.

The entire contents of Japanese Patent Application No. 2001-274153 (filed on Sep. 10, 2001) are herein incorporated by reference.

Although the present invention has been described with reference to a specific embodiment of the invention, the invention is not limited to the above-described embodiment. Various modification and variation of the embodiment described above will occur to those skilled in the art in light of the above teaching. The scope of the invention is defined with reference to the following claims.

What is claimed is:

1. A drive circuit for an electric motor, comprising:
   a circuit board;
   at least one semiconductor device mounted to the circuit board, the semiconductor device comprising a semiconductor chip, a chip package incorporating therein the semiconductor chip and comprising a mounting member for mounting on the circuit board, and terminals for connections of the semiconductor chip to the circuit board, at least one of the terminals formed in one piece and comprising a first end portion directly connected to a surface of the circuit board, a second end portion directly connected to a surface of the semiconductor chip and protruding through a surface of the chip package and a bent portion located between the first and second end portions, said surfaces of the semiconductor chip and the chip package extending perpendicular to said surface of the circuit board; and
   a spacer interposed between the circuit board and the mounting member of the chip package so as to provide a space between the circuit board and the chip package.

2. A drive circuit for an electric motor, comprising:
   a circuit board;
   at least one semiconductor device mounted to the circuit board, the semiconductor device comprising a semiconductor chip, a chip package incorporating therein the semiconductor chip and comprising a mounting member for mounting on the circuit board, and terminals for connections of the semiconductor chip to the circuit board, at least one of the terminals comprising a bent portion; and
   a spacer interposed between the circuit board and the mounting member of the chip package so as to provide a space between the circuit board and the chip package,
   wherein the mounting member of the chip package and the spacer comprise portions engaged with each other so as to allow play therebetween.

3. A drive circuit according to claim 2, wherein the engageable portion of the mounting member defines a hole, and wherein the engageable portion of the spacer comprises a protrusion.

4. A drive circuit for an electric motor, comprising:
   a circuit board;
   at least one semiconductor device mounted to the circuit board, the semiconductor device comprising a semiconductor chip, a chip package incorporating therein the semiconductor chip and comprising a mounting member for mounting on the circuit board, and terminals for connections of the semiconductor chip to the circuit board; and
   a spacer interposed between the circuit board and the mounting member of the chip package so as to provide a space between the circuit board and the chip package,
   wherein the mounting member of the chip package and the spacer comprise portions engageable with each other for proper positioning of the semiconductor device to the spacer,
   wherein the engageable portions of the mounting member and the spacer allow play therebetween, and
   wherein the engageable portion of the mounting member defines a hole, and
   wherein the engageable portion of the spacer comprises a protrusion loosely fitted in the hole.

5. A drive circuit for an electric motor, comprising:
   a circuit board;
   at least one semiconductor device mounted to the circuit board, the semiconductor device comprising a semiconductor chip, a chip package incorporating therein the semiconductor chip and comprising a mounting member for mounting on the circuit board, and terminals for connections of the semiconductor chip to the circuit board, the mounting member and the terminals protruding from opposite sides of the chip package; and
   a spacer interposed between the circuit board and the mounting member of the chip package so as to provide a space between the circuit board and the chip package,
   wherein at least one of the mounting member and the terminals is connected to a surface of the chip package perpendicular to the circuit board.

6. A drive circuit for an electric motor, comprising:
   a circuit board;
   at least one semiconductor device mounted to the circuit board, the semiconductor device comprising a semiconductor chip, a chip package incorporating therein the semiconductor chip and comprising a mounting member for mounting on the circuit board, and terminals for connections of the semiconductor chip to the circuit board, at least one of the terminals formed in one piece and comprising a first end portion directly connected to a surface of the circuit board and a second end portion directly connected to a surface of the semiconductor chip;
   a spacer interposed between the circuit board and the mounting member of the chip package so as to provide a space between the circuit board and the chip package;
   a lid and a case for installing therein the circuit board, the semiconductor device and the spacer,
   wherein the circuit board, the semiconductor device, the spacer and the lid are jointly fastened to the case.

7. A drive circuit for an electric motor, comprising:
   a circuit board;
   at least one semiconductor device mounted to the circuit board, the semiconductor device comprising a semiconductor chip, a chip package incorporating therein the semiconductor chip and comprising a mounting member for mounting on the circuit board, and terminals for connections of the semiconductor chip to the circuit board; and
   a spacer interposed between the circuit board and the mounting member of the chip package so as to provide a space between the circuit board and the chip package,
   wherein the circuit board and the spacer comprise portions engageable with each other for proper positioning of the spacer to the circuit board.

8. A drive circuit according to claim 7, wherein the engageable portion of the circuit board defines a hole, and wherein the engageable portion of the spacer comprises a protrusion fitted in the hole.

9. A drive circuit for an electric motor, comprising:
   a circuit board;
   at least one semiconductor device mounted to the circuit board, the semiconductor device comprising a semiconductor chip, a chip package incorporating therein the semiconductor chip and comprising a mounting member for mounting on the circuit board, and terminals for connections of the semiconductor chip to the circuit board; and
   a spacer interposed between the circuit board and the mounting member of the chip package so as to provide a space between the circuit board and the chip package, wherein the spacer comprises a step brought into contact with the chip package so as to provide a space between the chip package and the spacer.

10. A method for assembling a drive circuit for an electric motor, comprising:
placing a spacer on a circuit board;
providing at least one semiconductor device comprising a semiconductor chip, a chip package incorporating therein the semiconductor chip and comprising a mounting member for mounting on the circuit board, and terminals for connections of the semiconductor chip to the circuit board;
fitting the mounting member of the chip package onto the spacer with a space provided between the circuit board and the chip package; and then
soldering the terminals of the semiconductor device to the circuit board.

11. A method according to claim 10, further comprising installing the circuit board, the semiconductor device and the spacer in a lid and a case.

12. A method according to claim 11, further comprising jointly fastening the circuit board, the semiconductor device, the spacer and the lid to the case.

13. A method according to claim 10, wherein the mounting member of the chip package and the spacer comprises portions engageable with each other for proper positioning of the semiconductor device to the spacer.

14. A method according to claim 13, wherein the engageable portions of the mounting member and the spacer allow play therebetween.

15. A method according to claim 14, wherein the engageable portion of the mounting member defines a hole, and the engageable portion of the spacer comprises a protrusion loosely fit in the hole.

16. A method according to claim 10, wherein the circuit board and the spacer comprises portions engageable with each other for proper positioning of the spacer to the circuit board.

17. A method according to claim 16, wherein the engageable portion of the circuit board defines a hole, and the engageable portion of the spacer comprises a protrusion fitted in the hole.

18. A method according to claim 10, wherein the spacer comprises a step brought into contact with the chip package so as to provide a space between the chip package and the spacer.

19. A drive circuit for an electric motor, comprising:
a circuit board;
at least one semiconductor device mounted to the circuit board, the semiconductor device comprising a semiconductor chip, a chip package incorporating therein the semiconductor chip and comprising a mounting member integrally formed on the chip package for mounting the semiconductor device on the circuit board, and terminals for connections of the semiconductor chip to the circuit board, at least one of the terminals formed in one piece and comprising a first end portion directly connected to a surface of the circuit board and a second end portion directly connected to a surface of the semiconductor chip, the mounting member and the terminals protruding from opposite sides of the chip package; and
a spacer interposed between the circuit board and the mounting member of the chip package and held in contact with the circuit board and the mounting member so as to provide a space between the circuit board and the chip package.

20. A drive circuit for an electric motor, comprising:
a circuit board;
at least one semiconductor device mounted to the circuit board, the semiconductor device comprising a semiconductor chip and a chip package, the chip package comprising a main body incorporating therein the semiconductor chip, terminals for connections of the semiconductor chip to the circuit board and a mounting member for mounting on the circuit board, at least one of the terminals formed in one piece and having a first end portion directly connected to a surface of the circuit board and a second end portion directly connected to a surface of the semiconductor chip, the terminals protruding from the main body, the mounting member protruding from a portion of the main body, said portion of the main body being located in a side opposite to the circuit board; and
a spacer interposed between the circuit board and the mounting member of the chip package and held in contact with the circuit board and the mounting member so as to provide a space between the circuit board and the chip package.

21. A drive circuit for an electric motor, comprising:
a circuit board;
at least one semiconductor device mounted to the circuit board, the semiconductor device comprising a semiconductor chip, a chip package incorporating therein the semiconductor chip, the chip package comprising:
a mounting member for mounting on the circuit board;
terminals for connections of the semiconductor chip to the circuit board, at least one of the terminals formed in one piece and comprising a first end portion directly connected to a surface of the circuit board and a second end portion directly connected to a surface of the semiconductor chip; and
a spacer made of a resin and interposed between the circuit board and the mounting member of the chip package so as to provide a space between the circuit board and the chip package.

22. A drive circuit according to claim 21, further comprising:
a metallic reinforcing plate inserted in the spacer.

* * * * *